(12) United States Patent
Mendiola

(10) Patent No.: US 6,344,091 B2
(45) Date of Patent: *Feb. 5, 2002

(54) METHODS OF PROCESSING SEMICONDUCTOR WAFERS, METHODS OF SUPPORTING A PLURALITY OF SEMICONDUCTOR WAFERS, METHODS OF PROCESSING ELECTRONIC DEVICE WORKPIECES AND METHODS OF ORIENTING ELECTRONIC DEVICE WORKPIECES

(75) Inventor: Jeff Mendiola, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/785,828

(22) Filed: Feb. 16, 2001

Related U.S. Application Data

(63) Continuation of application No. 09/020,089, filed on Feb. 4, 1998, now Pat. No. 6,214,127.

(51) Int. Cl.⁷ .......................... B44C 1/22; C03C 15/00; C03C 25/68; C23G 1/00
(52) U.S. Cl. ............................. 134/2; 134/902; 216/58; 216/83; 216/91; 438/706; 438/716; 438/745
(58) Field of Search .................... 134/2, 902; 156/345; 438/706, 716, 745, 928; 206/832, 833, 710, 711; 216/91, 83, 58

(56) References Cited

U.S. PATENT DOCUMENTS

| 3,899,372 A | 8/1975 | Esch et al. |
| 3,934,733 A | 1/1976 | Worden ................... 432/239 X |
| 4,171,740 A | 10/1979 | Clement et al. ......... 206/213.1 |
| 4,219,835 A | 8/1980 | Van Loon et al. |
| 4,256,229 A | 3/1981 | Lee .............. 211/41 |
| 4,256,514 A | 3/1981 | Pogge |
| D260,237 S | 8/1981 | Fuzere ........................ D9/341 |
| 4,471,716 A | 9/1984 | Milliren ...................... 118/500 |
| 4,573,851 A | 3/1986 | Butler ........................ 414/404 |
| 4,574,950 A | 3/1986 | Koe et al. .................. 206/334 |
| 4,653,636 A | 3/1987 | Armstrong .................. 206/334 |
| 4,817,795 A | 4/1989 | Kos ........................... 206/328 |
| 4,949,848 A | 8/1990 | Kos .............................. 211/41 |
| 5,025,926 A | 6/1991 | Gregerson et al. .......... 206/444 |
| 5,101,976 A | 4/1992 | Salisbury .................... 206/454 |
| 5,111,936 A | 5/1992 | Kos ........................... 206/334 |
| 5,370,142 A | 12/1994 | Nishi et al. ................... 134/61 |
| 5,464,480 A | 11/1995 | Matthews |
| 5,605,246 A | 2/1997 | Rausch, Sr. et al. ........ 220/555 |
| 5,632,374 A | 5/1997 | Fitzsimmons et al. ... 206/308.1 |
| 5,704,494 A | 1/1998 | Nishikiori et al. .......... 206/454 |
| 5,706,946 A | 1/1998 | Kakizaki et al. ............ 206/454 |
| 5,725,101 A | 3/1998 | Kakizaki et al. ............ 206/711 |
| 5,782,361 A | 7/1998 | Kakizaki et al. ............ 206/711 |
| 5,782,362 A | 7/1998 | Ohori ......................... 206/711 |
| 5,862,823 A | 1/1999 | Kamikawa et al. |
| 5,921,397 A | 7/1999 | Whalen ...................... 206/711 |
| 5,960,960 A | 10/1999 | Yamamoto .................. 208/711 |
| 6,214,127 B1 * | 4/2001 | Mendiola ...................... 134/2 |

* cited by examiner

Primary Examiner—Zeinab El-Arini
(74) Attorney, Agent, or Firm—Wells, St. John et al.

(57) ABSTRACT

An aspect of the present invention provides a method of processing electronic device workpieces, individual electronic device workpieces having a front surface and a back surface, the method includes providing an electronic device workpiece carrier including a plurality of workpiece receivers; positioning individual electronic device workpieces within the workpiece receivers, the positioning orienting the front surface of one electronic device workpiece to face the front surface of a first immediately adjacent electronic device workpiece and orienting the back surface of the one electronic device workpiece to face the back surface of a second immediately adjacent electronic device workpiece; and positioning the electronic device workpiece carrier within an electronic device workpiece processor and processing the electronic device workpieces with the electronic device workpieces so oriented.

37 Claims, 6 Drawing Sheets

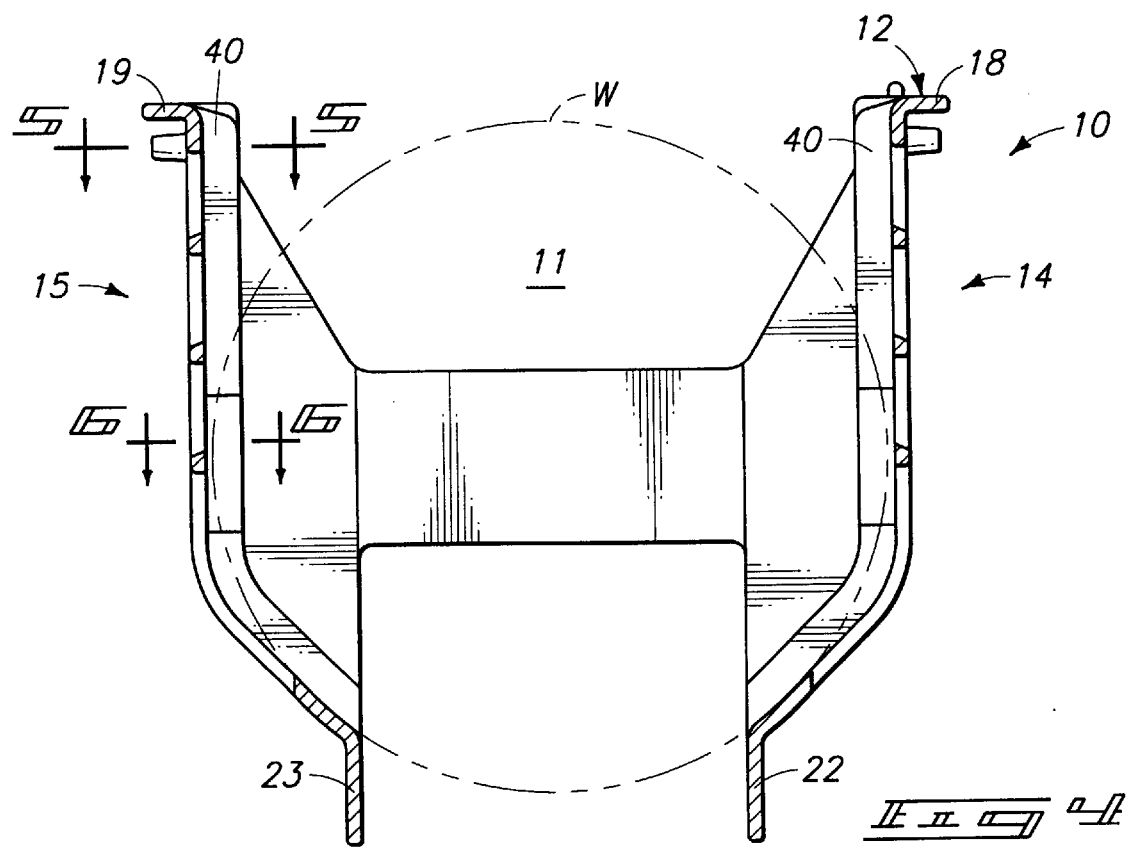
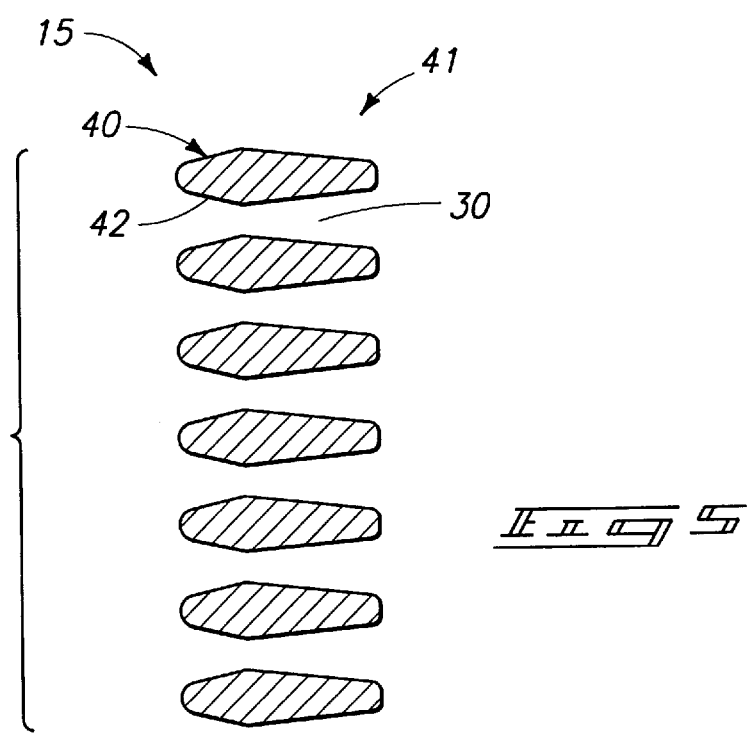

METHODS OF PROCESSING SEMICONDUCTOR WAFERS, METHODS OF SUPPORTING A PLURALITY OF SEMICONDUCTOR WAFERS, METHODS OF PROCESSING ELECTRONIC DEVICE WORKPIECES AND METHODS OF ORIENTING ELECTRONIC DEVICE WORKPIECES

RELATED PATENT DATA

This application is a continuation application of prior application Ser. No. 09/020,089, filed on Feb. 4, 1998, and now U.S. Pat. No. 6,214,127, entitled "Methods of Processing Electronic Device Workpieces and Methods of Positioning Electronic Device Workpieces Within a Workpiece Carrier"; by the following named inventor: Jeff Mendiola; the disclosure of which is incorporated herein by reference.

TECHNICAL FIELD

The present invention relates to electronic device workpiece carriers, methods of processing electronic device workpieces, and methods of positioning electronic device workpieces within a workpiece carrier.

BACKGROUND OF THE INVENTION

Semiconductor wafer carriers, also referred to as semiconductor wafer cassettes, are known in the art. Such carriers are typically utilized for storage, transportation and processing of semiconductor wafers. The semiconductor wafer carriers are configured to carry a plurality of semiconductor wafers or workpieces. In particular, the semiconductor wafer carriers usually include a plurality of slots individually configured to receive a single semiconductor wafer.

Typically, the semiconductor wafers are arranged within the wafer carrier outside of a semiconductor processor. The semiconductor wafer carrier is thereafter transported, with the semiconductor wafers inside, into the processing apparatus. Some semiconductor processors are typically configured to process the semiconductor wafers within the wafer carrier.

During most wafer processing steps, it is preferred or necessary to completely expose the front surfaces of the semiconductor wafers being processed to ensure complete processing. Therefore, the front surfaces of the semiconductor wafers being processed are spaced from other wafers or wafer carrier surfaces to facilitate complete exposure of the surfaces to processing fluids. In the prior art, semiconductor wafers are arranged with their front surfaces facing in one direction. Additionally, one empty slot is usually provided intermediate immediately adjacent semiconductor wafers to facilitate exposure of the respective front surfaces of the wafers to the processing fluids.

Conventional spacing or arrangement of the semiconductor wafers reduces the number of semiconductor wafers which can be loaded into a wafer carrier. Accordingly, fewer semiconductor wafers are processed within a single wafer carrier reducing processing throughput.

In addition, the diameter of semiconductor wafers continues to increase as the demand for higher chip and die yields from a single semiconductor wafer increases. Providing semiconductor wafers having increased diameters has resulted in a need for improved processing methods and apparatus.

SUMMARY OF THE INVENTION

The present invention provides workpiece carriers individually configured to receive a plurality of electronic device workpieces. Further, methods are provided for processing electronic device workpieces and positioning electronic device workpieces within a workpiece carrier. Provision of the electronic device workpieces within the workpiece carrier in accordance with the present invention facilitates processing of the electronic device workpieces.

One embodiment of the present invention provides an electronic device workpiece carrier which includes a body and a plurality of workpiece receivers defined by the body. At least some of the workpiece receivers of the workpiece carrier are spaced from immediately adjacent workpiece receivers at different distances.

Electronic device workpieces are preferably arranged in pairs in certain embodiments of the present invention. Some pairs of electronic device workpieces are spaced farther apart than other pairs of electronic device workpieces according to one aspect of the present invention. One electronic device workpiece may be common to more than one pair of workpieces.

One method of processing electronic device workpieces according to the present invention provides arranging of pairs of electronic device workpieces within workpiece receivers of a workpiece carrier. Front surfaces of electronic device workpieces face one another in some pairs of workpieces, and back surfaces of electronic device workpieces face one another in other pairs of workpieces. The faced front surfaces of immediately adjacent electronic device workpieces are preferably spaced by a distance which is greater than a distance intermediate faced back surfaces of immediately adjacent electronic device workpieces. Alternatively, greater spacing is provided intermediate faced back surfaces compared with the spacing intermediate faced front surfaces. Such an arrangement is typically utilized when processing of the back surfaces of the workpieces is desired.

Pairs of electronic device workpieces arranged within workpiece receivers of the workpiece carrier are spaced by at least one empty workpiece receiver in some embodiments of the invention.

Electronic device workpieces are processed according to certain aspects of the invention following arrangement of the workpieces within the workpiece carrier. Such processing includes wet processing of the electronic device workpieces in some embodiments. Arrangement of the electronic device workpieces within a workpiece carrier in accordance with the present invention improves manufacturing efficiency of the workpieces.

BRIEF DESCRIPTION OF THE DRAWINGS

Preferred embodiments of the invention are described below with reference to the following accompanying drawings.

FIG. 4 is a cross-sectional view of the workpiece carrier taken along line 4—4 of FIG. 2.

FIG. 5 is a cross-sectional view taken along line 5—5 of FIG. 4 showing upper portions of guides of the workpiece carrier.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
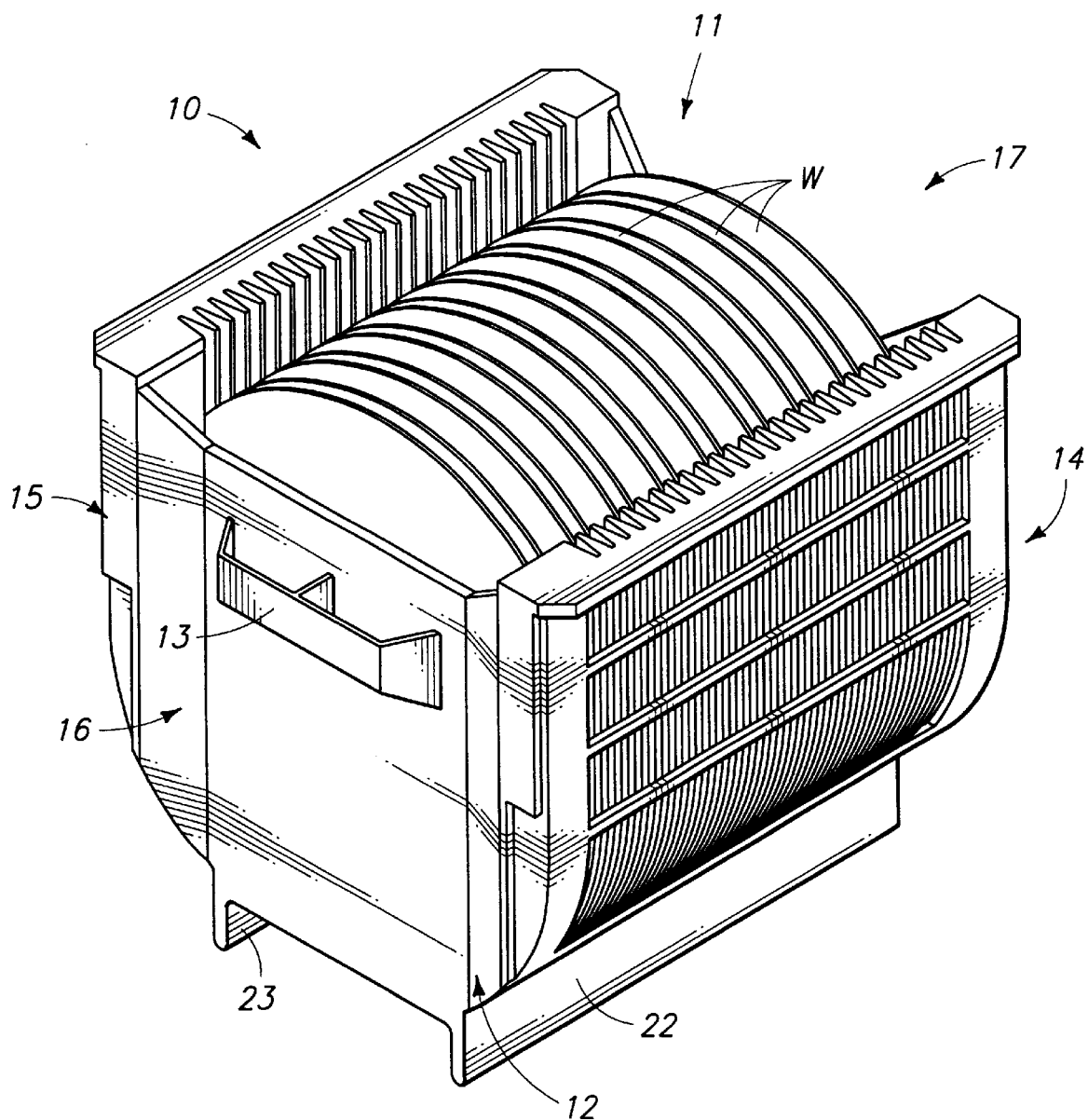
FIG. 1 is an isometric view of a workpiece carrier holding a plurality of electronic device workpieces.

Referring to FIG. 1, one embodiment of a workpiece carrier 10 configured to store plural electronic industry workpieces or electronic device workpieces W is shown. Exemplary electronic device workpieces W include semiconductor wafers, glass or quartz substrates for flat panel or field emission display devices, etc. Such electronic device workpieces W can comprise silicon, glass, quartz or other materials. Typical workpieces W are processed and subsequently utilized in electronic devices of various configurations.

The illustrated workpiece carrier 10 includes a first side 14 and a second side 15 opposite first side 14. Workpiece carrier 10 also includes a front portion or side 16 and a rear or back portion 17. Workpiece carrier 10 generally includes a body 12. Body 12 defines an internal bay portion 11 for receiving a plurality of vertically oriented electronic device workpieces W. Body 12 of workpiece carrier 10 includes a pair of parallel legs 22, 23 for supporting workpiece carrier 10 and workpieces W therein. Further, body 12 of workpiece carrier 10 includes a handle 13 for facilitating handling of workpiece carrier 10 and electronic device workpieces W therein.

Figure 2:
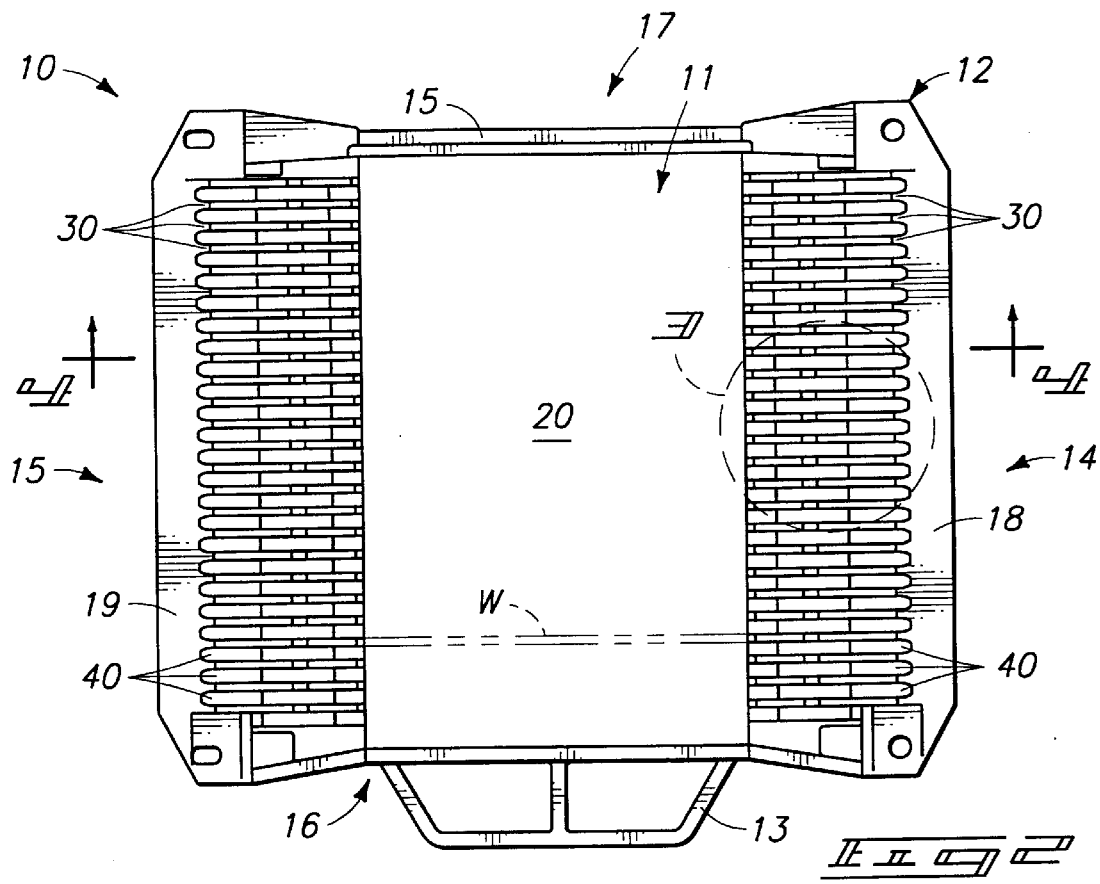
FIG. 2 is an elevated top view of the workpiece carrier shown in FIG. 1.

Referring to FIG. 2, internal bay portion 11 is shown. Bay 11 is configured to receive plural electronic device workpieces W (one electronic device workpiece is shown in phantom in FIG. 2). Internal bay portion 11 of body 12 has a basket-like configuration in the illustrated embodiment. Side portions 14, 15 of body 12 define plural slots or workpiece receivers 30. Workpiece receivers 30 are configured to receive and hold electronic device workpieces W. Workpiece receivers 30 are adapted to hold electronic device workpieces W in a vertical orientation within bay portion 11.

In the illustrated embodiment, side portion 14 defines plural workpiece receivers 30 and opposite side portion 15 defines plural workpiece receivers 30 which correspond to the workpiece receivers of side portion 14. Corresponding workpiece receivers of side portions 14, 15 are configured to receive electronic device workpieces W. A pair of workpiece receivers 30 receives a single electronic device workpiece W as shown. Although only three workpiece receivers 30 of individual side portions 14, 15 are labeled with reference numbers in FIG. 2, workpiece receivers 30 laterally extend along the respective sides 14, 15 in the preferred embodiment. Sides 14, 15 respectively include a plurality of spacers or guides 40 which define workpiece receivers 30.

Figure 3:
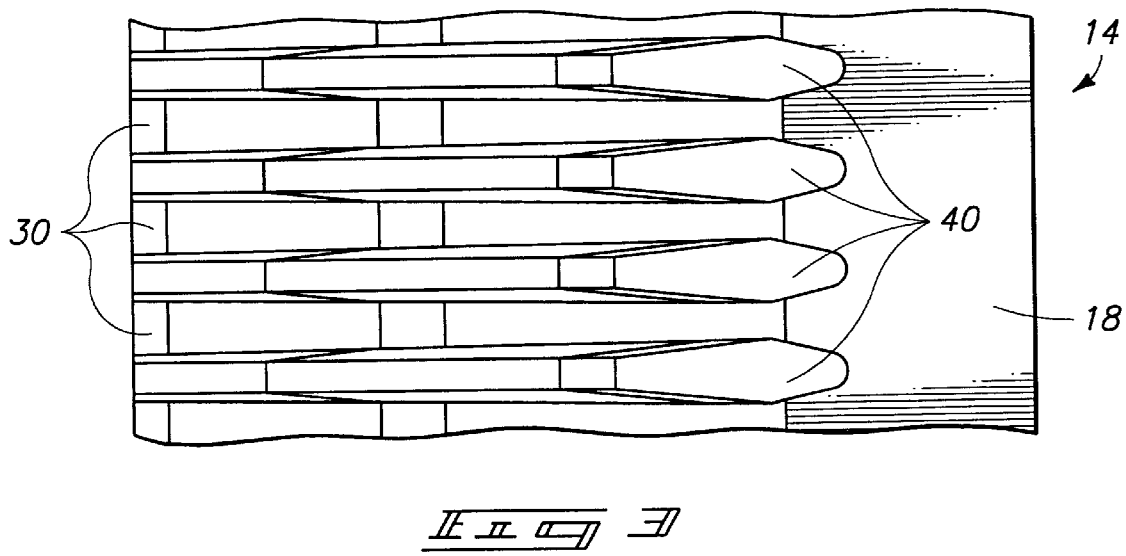
FIG. 3 is an elevated top view showing guides of the workpiece carrier in detail.

Referring to FIG. 3, guides 40 of workpiece carrier 10 are shown in detail. Guides 40 are configured to receive and support electronic device workpieces W within workpiece receivers 30. Individual workpiece receivers 30 are configured to receive a single electronic device workpiece W in the described embodiment. In particular, two immediately adjacent guides 40 form a single workpiece receiver 30 and support a single electronic device workpiece W. Workpiece carrier 10 may be configured for either full V-slot spacing or half V-slot spacing. A workpiece carrier 10 configured for full V-slot spacing typically provides twenty-five V-slots or workpiece receivers 30 per workpiece carrier 10. A workpiece carrier 10 configured for half V-slot spacing typically provides fifty V-slots or workpiece receivers 30 per carrier 10.

Referring to FIG. 4, receiving bay 11 of workpiece carrier 10 intermediate sides 14, 15 is shown. Positioning of an electronic device workpiece W within bay 11 is shown in phantom in FIG. 4. Guides 40 defined and supported by sides 14, 15 are configured to vertically orient electronic device workpieces W within workpiece carrier 10 for storage and processing. Sides 14, 15 have respective lip portions 18, 19 and legs 22, 23. Guides 40 extend from lip portions 18, 19 to respective leg portions 22, 23 in the illustrated embodiment. Guides 40 are configured to receive electronic device workpieces W and prevent excessive horizontal movement of the workpieces within bay 11 during movement of the workpiece carrier 10 and processing of the electronic device workpieces W.

Referring to FIG. 5, an array 41 of plural upper portions 42 of guides 40 is shown. All guides 40 include upper portions 42 in the preferred embodiment of the invention although only seven upper portions 42 are shown in FIG. 5. Pairs of immediately adjacent guides 40 define a workpiece receiver 30. In the illustrated embodiment, upper portions 42 of guides 40 form upper portions of workpiece receivers 30 configured to accept or receive electronic device workpieces W. Upper portions 42 guide the workpiece's into bay 11 of workpiece carrier 10.

Figure 6:
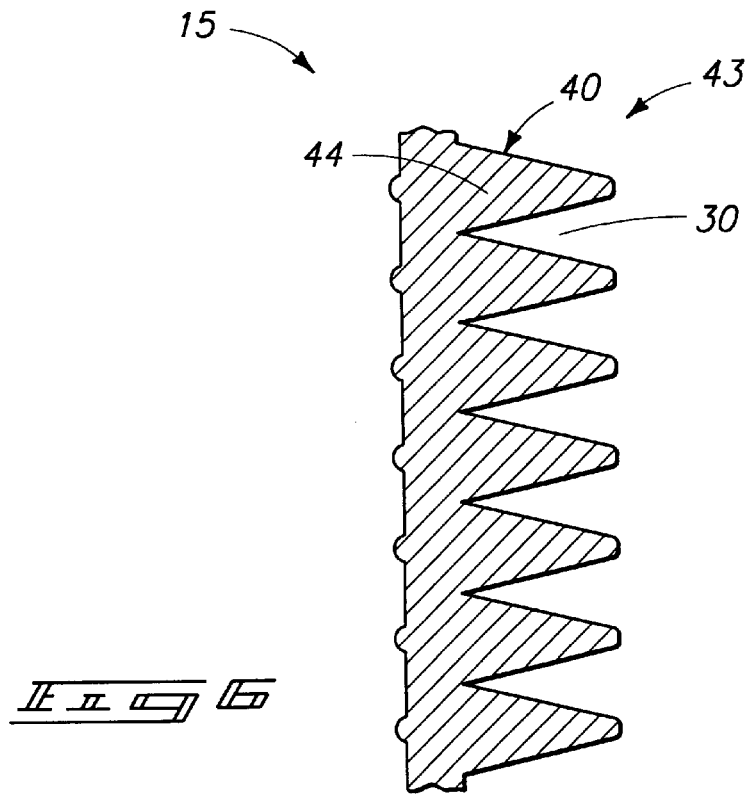
FIG. 6 is a cross-sectional view taken along line 6—6 of FIG. 4 showing lower portions of guides of the workpiece carrier.

Referring to FIG. 6, an array 43 of lower portions 44 of guides 40 are shown. Corresponding to upper portions 42, pairs of lower portions 44 of guides 40 also define workpiece receivers 30 adapted to receive and hold electronic device workpieces W therein. Lower portions 44 of guides 40 align and hold electronic device workpieces W positioned within bay 11. In the preferred embodiment of the invention, all guides 40 include lower portions 44 although only seven lower portions are shown in FIG. 6.

Figure 7:
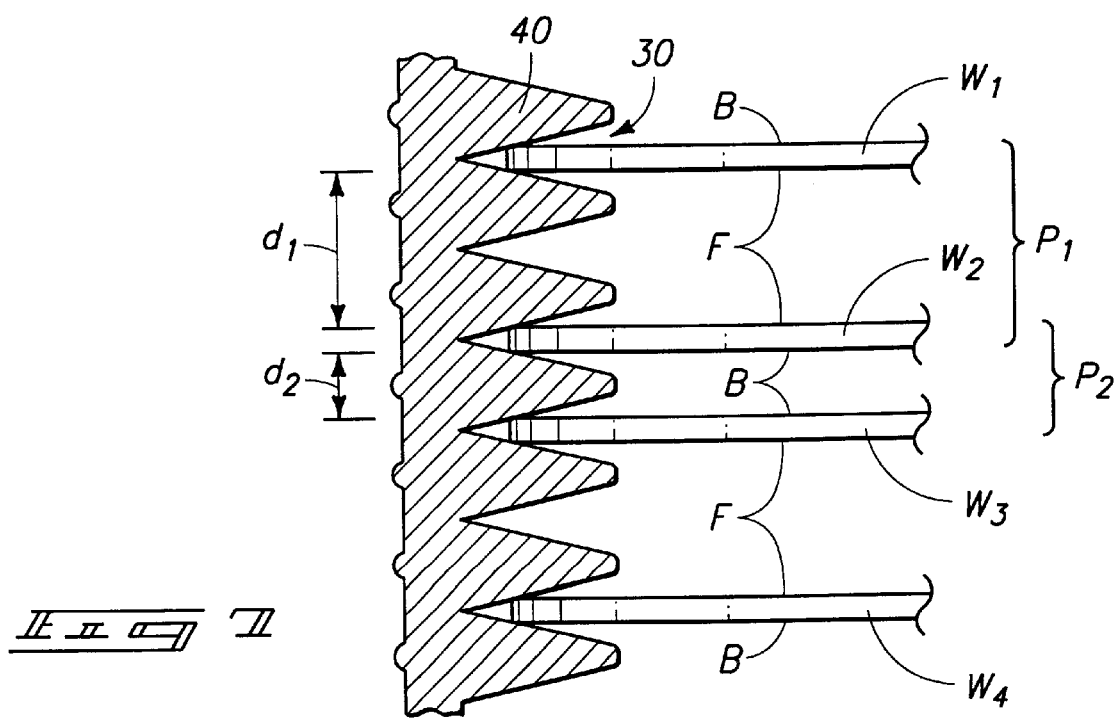
FIG. 7 is a cross-sectional view, similar to FIG. 6, of plural electronic device workpieces arranged intermediate selected guides of the workpiece carrier.

Referring to FIG. 7, an arrangement of electronic device workpieces W within workpiece carrier 10 in accordance with a first embodiment of the invention is shown. Only an exemplary number of guides 40 and workpiece receivers 30 defined thereby are shown in FIG. 7. In preferred implementations, the depicted arrangement of electronic device workpieces W is repeated along the entire sides 14, 15 of workpiece carrier 10.

Four electronic device workpieces $W_1$–$W_4$ are shown received and held by corresponding workpiece receivers 30 in FIG. 7. Individual workpieces W include a front surface and a back surface. Front and back surfaces of electronic device workpieces $W_1$–$W_4$ are indicated by the letters "F" and "B", respectively. Front surfaces generally refer to the surfaces of workpieces W which typically receive the predominate portion of the processing. For example, components (e.g., semiconductive components) or electrical circuitry are typically fabricated upon front surfaces of the workpieces W. Exemplary electrical circuitry includes logic circuitry and memory circuitry.

Alternately considered, surfaces of adjacent workpieces can be referred to as first like surfaces and second like surfaces. First like surfaces can refer to either front surfaces or back surfaces of the workpieces, and second like surfaces can refer to either back surfaces or front surfaces of the workpieces, respectively.

The electronic device workpieces W are arranged such that a front surface F of an electronic device workpiece faces a front surface F of an immediately adjacent electronic device workpiece (e.g. electronic device workpieces $W_1$ and $W_2$). Additionally, electronic device workpieces W are arranged such that a back surface of an electronic device workpiece faces a back surface of an immediately adjacent electronic device workpiece (e.g. electronic device workpieces $W_2$ and $W_3$).

For reference herein, electronic device workpieces W may be referred to as pairs where appropriate. For example, one pair $P_1$ includes electronic device workpieces $W_1$ and $W_2$ and another pair $P_2$ comprises electronic device workpieces $W_2$ and $W_3$. Electronic device workpiece $W_2$ is common to both described pairs $P_1$, $P_2$ of electronic device workpieces 44.

In accordance with one embodiment of the present invention, an empty or unused workpiece receiver 30 is provided intermediate the electronic device workpieces $W_1$, $W_2$ of the pair $P_1$. Further, electronic device workpieces $W_2$, $W_3$ of the pair $P_2$ are provided in immediately adjacent workpiece receivers 30. Spacing the electronic device workpieces $W_1$, $W_2$ of the pair $P_1$ by an empty workpiece receiver 30 provides a double or full spaced distance "$d_1$" intermediate the respective front surfaces of electronic device workpieces $W_1$, $W_2$. Provision of the electronic device workpieces $W_2$, $W_3$ of the pair $P_2$ within immediately adjacent workpiece receivers 30 provides a single or half spaced distance "$d_2$" intermediate the respective back surfaces of electronic device workpieces $W_2$, $W_3$.

Distances $d_1$ and $d_2$ are different in preferred embodiments of the invention. In particular, the distance $d_1$ intermediate the front surfaces of electronic device workpieces $W_1$, $W_2$ is greater than the distance $d_2$ intermediate the back surfaces of electronic device workpieces $W_2$, $W_3$. Separating the front surfaces of the electronic device workpieces W by an increased distance improves the exposure of the front surfaces to processing chemicals. The provision of increased spacing in accordance with the present invention optimizes flow of processing fluids over the front surfaces of the electronic device workpieces W. The spacing of the front surfaces of the electronic device workpieces W is preferably sufficient to provide complete exposure of the front surfaces to the etching or other processing fluids. In some processes, it is desired to provide complete cleaning of the front surfaces of the electronic device workpieces W while processing of the back surfaces may be of no concern.

In other processes, processing of the back surfaces of workpieces W is desired (e.g., removing an organic layer from the back surfaces). Thus, electronic device workpieces W can be arranged within workpiece carrier 10 providing increased spacing intermediate faced back surfaces of immediately adjacent workpieces compared with the spacing provided intermediate faced front surfaces of immediately adjacent workpieces. For example, an empty workpiece receiver 30 can be provided intermediate workpieces $W_2$, $W_3$. In such an arrangement, distance $d_2$ intermediate the back surfaces of workpieces $W_2$, $W_3$ is greater than distance $d_1$ intermediate the front surfaces of workpieces $W_1$, $W_2$.

Arrangement of electronic device workpieces W within workpiece carrier 10 in accordance with the present invention increases processing throughput. For example, seventeen electronic device workpieces W are provided within a full V-slot spacing workpiece carrier 10 as shown in FIG. 1. Only thirteen electronic device workpieces W can be stored in a similar workpiece carrier 10 using conventional arrangement methods.

Figure 8:
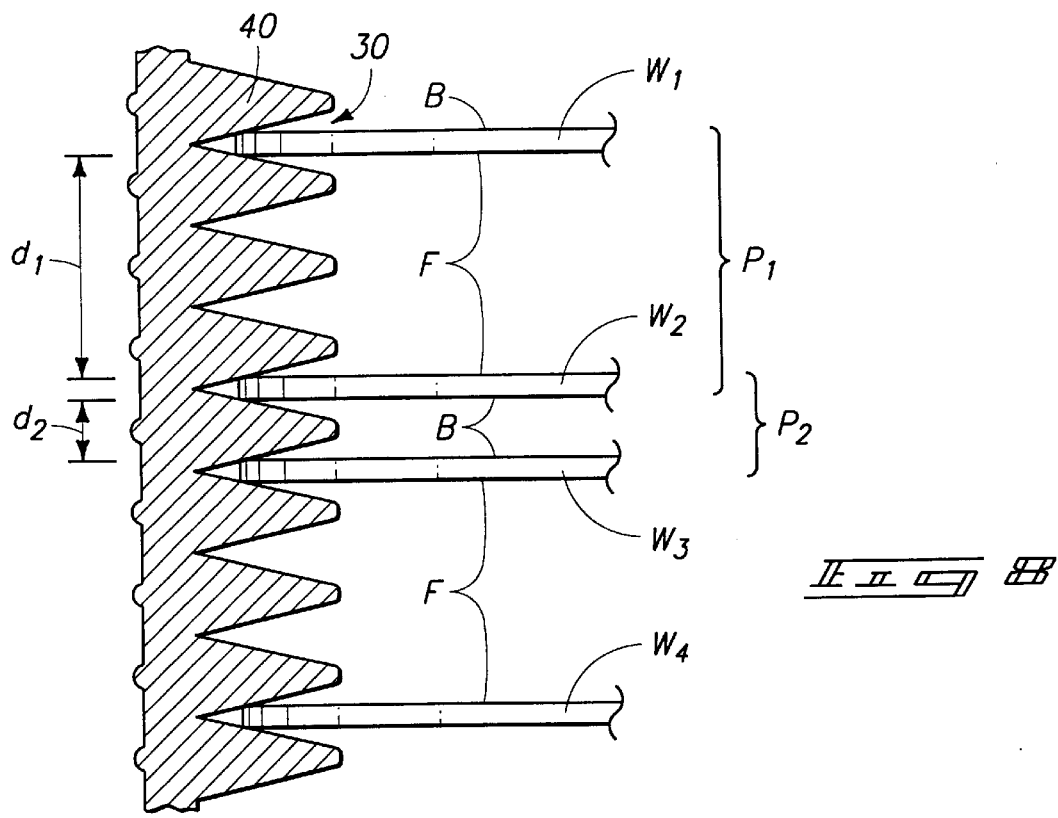
FIG. 8 is a cross-sectional view, similar to FIG. 6, of another arrangement of electronic device workpieces intermediate selected guides of the workpiece carrier.

Referring to FIG. 8, another arrangement of electronic device workpieces W within workpiece carrier 10 is depicted. Only an exemplary number of guides 40 and workpiece receivers 30 defined thereby are shown in FIG. 8. In preferred implementations, the depicted arrangement of electronic device workpieces W is repeated along the entire sides 14, 15 including the workpiece receivers 30 of workpiece carrier 10. Similar to FIG. 7, one pair $P_1$ of electronic device workpieces includes workpieces $W_1$, $W_2$, Another pair $P_2$ of electronic device workpieces includes workpieces $W_2$, $W_3$. Electronic device workpiece $W_2$ is common to both described pairs $P_1$, $P_2$ of electronic device workpieces. Two empty workpiece receivers 30 are provided intermediate electronic device workpieces $W_1$, $W_2$ comprising the pair $P_1$ according to the aspect of the invention shown in FIG. 8. More than two empty workpiece receivers 30 are provided intermediate the front surfaces F of electronic device workpieces $W_1$, $W_2$ in other embodiments.

Providing the empty workpiece receivers 30 provides a distance $d_1$ intermediate the front surfaces F of electronic device workpieces $W_1$, $W_2$. The distance $d_1$ shown in FIG. 8 is even greater than the distance $d_1$ shown in FIG. 7. The arrangement shown in FIG. 8 provides additional spacing intermediate front surfaces F of immediately adjacent electronic device workpieces $W_1$, $W_2$ of the first pair $P_1$ In the depicted embodiment, the electronic device workpieces $W_2$, $W_3$ of the other pair $P_2$ are provided in immediately adjacent workpiece receivers 30. In addition, the back surfaces of electronic device workpieces $W_2$, $W_3$ of pair $P_2$ face one another as shown in FIG. 8.

Distance $d_1$ separating front surfaces F of immediately adjacent electronic device workpieces $W_1$, $W_2$ is greater than distance $d_2$ separating back surfaces B of immediately adjacent electronic device workpieces $W_2$, $W_3$. Separating the front surfaces F of the electronic device workpieces W by an increased distance improves the exposure of the front surfaces F to processing chemicals.

Figure 9:
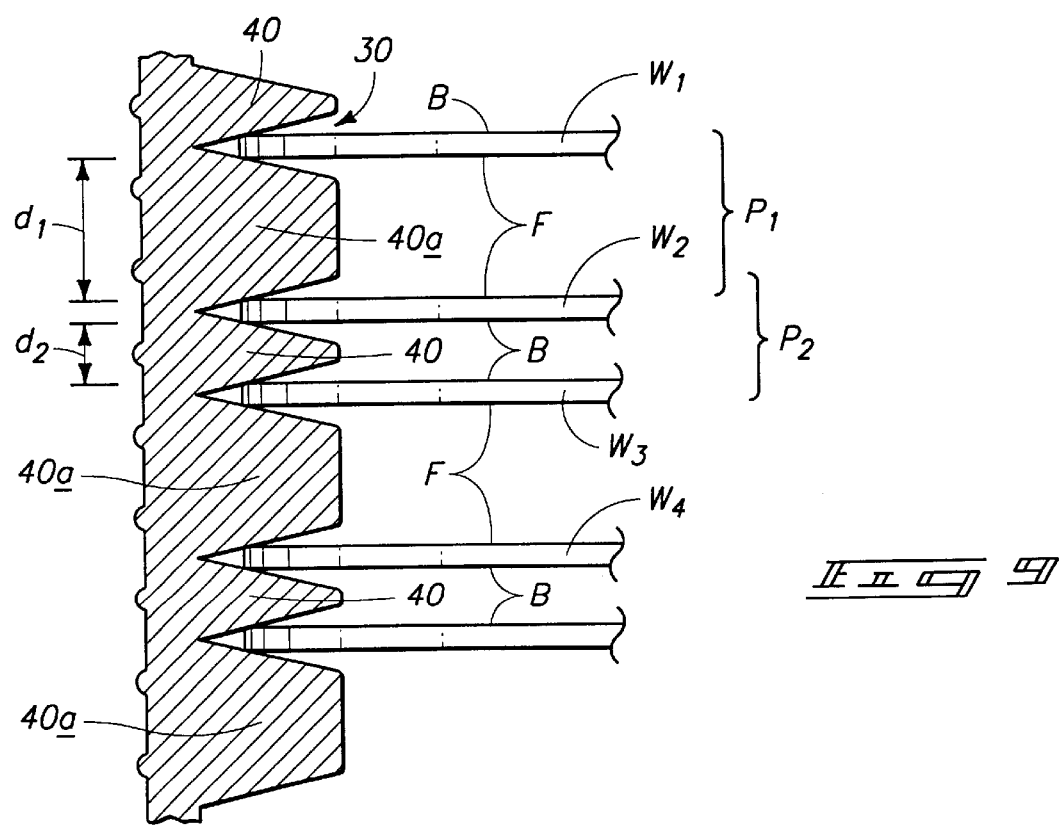
FIG. 9 is a cross-sectional view, similar to FIG. 8, illustrating an alternative embodiment of guides of a workpiece carrier.

Referring to FIG. 9, another embodiment of the present invention is shown. Although only an exemplary portion of workpiece carrier 10 is shown in FIG. 9, the depicted arrangement of electronic device workpieces W is repeated across the entire length of workpiece carrier 10 and sides 14, 15 thereof in a preferred embodiment.

Guides 40, 40a having differing widths are shown in FIG. 9. As illustrated, guides 40a individually have a greater width compared with the width of individual guides 40. Two exemplary pairs $P_1$, $P_2$ of electronic device workpieces are shown in FIG. 9. One pair $P_1$ of electronic device workpieces includes workpieces $W_1$, $W_2$ which straddle guide 40a. Front surfaces F of the electronic device workpieces $W_1$, $W_2$ of the first pair $P_1$ face one another. Straddling of guide 40a provides a distance $d_1$ intermediate front surfaces F of immediately adjacent electronic device workpieces $W_1$, $W_2$ of first pair $P_1$.

Another pair $P_2$ of electronic device workpieces, including workpieces $W_2$, $W_3$, straddles a thinner guide 40 as shown. The back surfaces of electronic device workpieces $W_2$, $W_3$ face one another in the arrangement shown in FIG. 9. Straddling of the pair $P_2$ of workpieces $W_2$, $W_3$ about guide 40 spaces the back surfaces B of the respective electronic device workpieces $W_2$, $W_3$ by a distance $d_2$. Electronic device workpiece $W_2$ is common to the pairs $P_1$, $P_2$ of electronic device workpieces including workpieces $W_1$, $W_2$ and workpieces $W_2$, $W_3$, respectively.

Distance $d_1$ separating front surfaces F of immediately adjacent electronic device workpieces $W_1$, $W_2$ is greater than distance $d_2$ separating back surfaces B of immediately adjacent electronic device workpieces $W_2$, $W_3$. Separating the front surfaces F of the electronic device workpieces W by an increased distance improves the exposure of the front surfaces to processing chemicals and facilitates processing of the workpieces.

Figure 10:
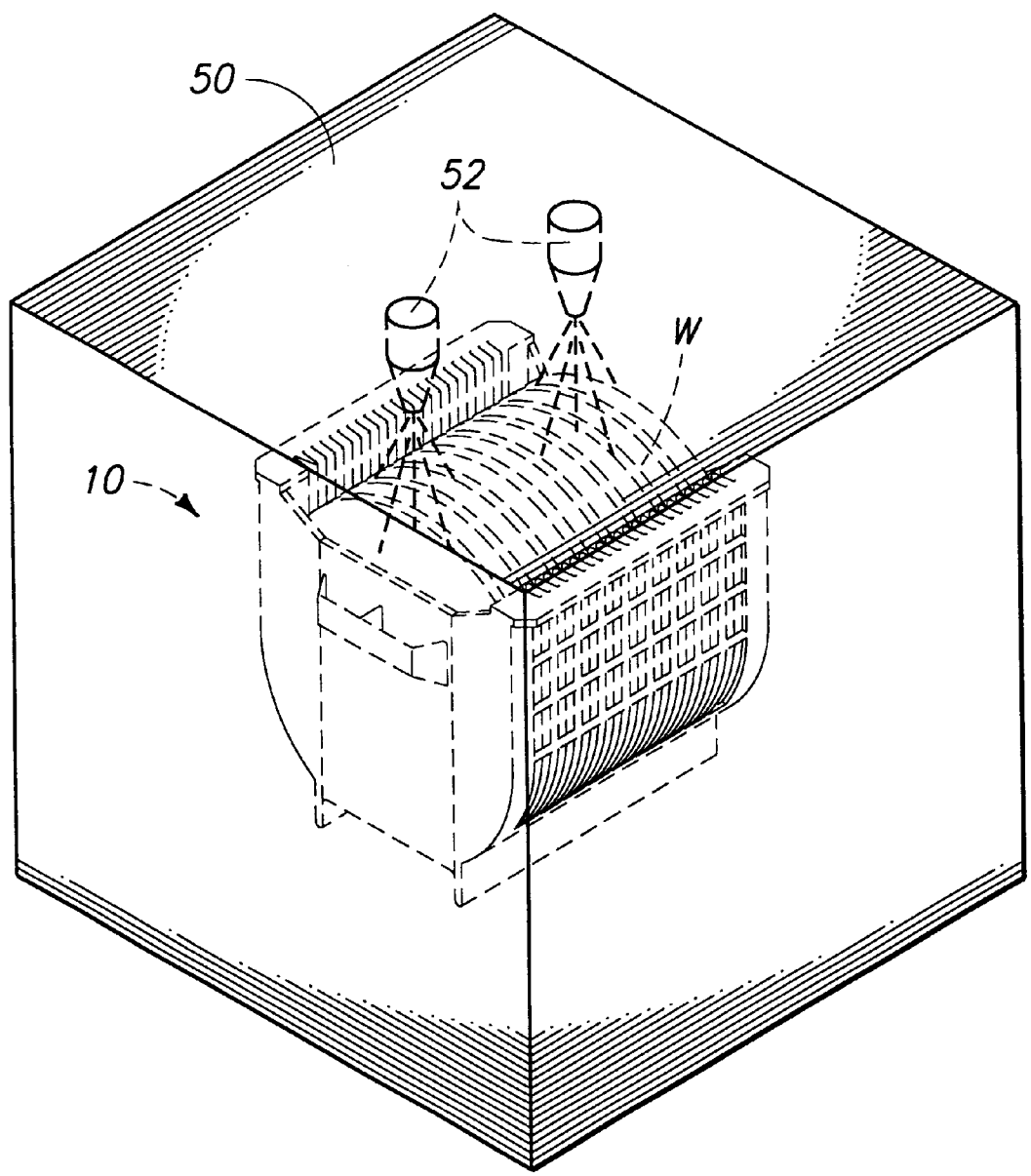
FIG. 10 is an isometric view of a workpiece carrier including plural electronic device workpieces within a workpiece processor.

Referring to FIG. 10, a workpiece carrier 10 is shown within a workpiece processor 50. The illustrated workpiece carrier 10 includes a plurality of electronic device workpieces W. Workpiece processor 50 is configured to provide processing of the electronic device workpieces W in the described embodiment. Preferably, workpiece processor 50 provides wet processing of electronic device workpieces W. For example, workpiece processor 50 may be configured to implement processing of the electronic device workpieces W which includes removing organic materials from the electronic device workpieces as disclosed in U.S. Pat. No. 5,464,480 to Matthews, incorporated herein by reference.

The illustrated workpiece processor 50 includes nozzles 52 configured to spray processing chemicals (liquid or gas) toward workpiece carrier 10 and electronic device workpieces W therein. In other embodiments, workpiece processor 50 is configured to quench the electronic device workpieces W. In such a configuration, workpiece carrier 10 and workpieces W are dipped into a process solution within the workpiece processor. The process solution is then flowed past the surfaces of the workpieces W. The present invention is not limited to the described processing methods.

Arrangement of electronic device workpieces W within the workpiece carrier 10 in accordance with the present invention facilitates coverage of processing fluids across the entire front surfaces of the respective electronic device workpieces W. Although preferred, processing of the electronic device workpieces W in accordance with the present invention is not limited to wet processing applications.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of processing semiconductor wafers comprising:
    positioning a plurality of semiconductor wafers within a carrier, the positioning comprising orienting a first like surface of one of the semiconductor wafers to face a first like surface of another immediately adjacent semiconductor wafer;
    providing the carrier within a semiconductor wafer processor after the positioning; and
    processing the semiconductor wafers as so oriented within the carrier using the semiconductor wafer processor.

2. The method of claim 1 wherein the carrier comprises a wafer cassette.

3. The method of claim 1 wherein the processing comprises processing the semiconductor wafers provided in a substantially parallel orientation.

4. A method of processing semiconductor wafers comprising:
    positioning a plurality of semiconductor wafers within a carrier including providing a first pair of immediately adjacent semiconductor wafers spaced from one another by a first distance and providing a second pair of immediately adjacent semiconductor wafers spaced from one another by a second distance different than the first distance;
    providing the carrier within a semiconductor wafer processor after the positioning; and
    processing the semiconductor wafers as so oriented within the carrier using the semiconductor wafer processor.

5. The method of claim 1 wherein the carrier comprises a wafer cassette.

6. The method of claim 4 wherein the processing comprises processing the semiconductor wafers provided in a substantially parallel orientation.

7. A method of supporting a plurality of semiconductor wafers comprising:
    providing a semiconductor wafer cassette configured to receive a plurality of semiconductor wafers; and
    positioning a plurality of semiconductor wafers within the semiconductor wafer cassette, the positioning including orienting a like surface of one of the semiconductor wafers to face a like surface of another immediately adjacent semiconductor wafer.

8. The method of claim 7 wherein the positioning comprises positioning the semiconductor wafers in a substantially parallel orientation.

9. A method of supporting a plurality of semiconductor wafers comprising:
    providing a semiconductor wafer cassette configured to receive a plurality of semiconductor wafers; and
    positioning a plurality of semiconductor wafers within the semiconductor wafer cassette, the positioning including providing a first pair of immediately adjacent semiconductor wafers spaced from one another by a first distance and providing a second pair of immediately adjacent semiconductor wafers spaced from one another by a second distance different than the first distance.

10. The method of claim 9 wherein the positioning comprises positioning the semiconductor wafers in a substantially parallel orientation.

11. The method of claim 9 wherein the positioning further comprises orienting a like surface of one of the semiconductor wafers to face a like surface of another immediately adjacent semiconductor wafer.

12. A method of processing electronic device workpieces comprising:
    orienting a first pair of immediately adjacent electronic device workpieces closer together than a second pair of immediately adjacent electronic device workpieces within an electronic device workpiece carrier;
    providing the electronic device workpiece carrier within an electronic device workpiece processor after the orienting; and
    processing the electronic device workpieces as so oriented within the electronic device workpiece carrier using the electronic device workpiece processor.

13. The method of claim 12 wherein the electronic device workpieces comprise semiconductor wafers.

14. The method of claim 12 wherein the orienting comprises orienting the electronic device workpieces with like surfaces of immediately adjacent electronic device workpieces facing one another.

15. The method of claim 12 wherein the electronic device workpiece carrier comprises a wafer cassette.

16. The method of claim 12 wherein the processing comprises processing the electronic device workpieces provided in a substantially parallel orientation.

17. A method of processing electronic device workpieces comprising:
    orienting a pair of immediately adjacent electronic device workpieces within an electronic device workpiece carrier, the orienting comprising orienting the pair of immediately adjacent electronic device workpieces with like surfaces facing one another;
    providing the electronic device workpiece carrier within an electronic device workpiece processor after the orienting; and
    processing the electronic device workpieces as so oriented within the electronic device workpiece carrier using the electronic device workpiece processor.

18. The method of claim 17 wherein the electronic device workpieces comprise semiconductor wafers.

19. The method of claim 17 wherein the orienting comprises orienting the electronic device workpieces within the electronic device workpiece carrier comprising a wafer cassette.

20. The method of claim 17 wherein the processing comprises processing the electronic device workpieces provided in a substantially parallel orientation.

21. A method of orienting electronic device workpieces within an electronic device workpiece processor comprising:
    providing a pair of electronic device workpieces within an electronic device workpiece processor, the providing comprising orienting the electronic device workpieces in a substantially parallel orientation with respect to one another and positioning the electronic device workpieces with like surfaces of the electronic device workpieces facing one another.

22. The method of claim 21 wherein the pair of electronic device workpieces comprise semiconductor wafers.

23. The method of claim 21 wherein the providing comprises providing the pair of electronic device workpieces comprising semiconductor wafers within a wafer cassette and providing the wafer cassette containing the semiconductor wafers within the electronic device workpiece processor.

24. The method of claim 21 wherein the positioning comprises positioning the electronic device workpieces with the like surfaces comprising front surfaces facing one another.

25. The method of claim 21 wherein the providing comprises providing the pair of electronic device workpieces within an electronic device workpiece carrier and providing the electronic device workpiece carrier containing the electronic device workpieces within the electronic device workpiece processor.

26. The method of claim 21 wherein the electronic device workpiece carrier comprises a plurality of guides configured to define workpiece receivers configured to receive the electronic device workpieces and which extend a distance at least half a diameter of one of the electronic device workpieces.

27. The method of claim 21 wherein the electronic device workpiece carrier comprises a plurality of guides configured to define workpiece receivers configured to receive the electronic device workpieces and wherein the guides have different widths in a direction substantially perpendicular to opposing front and back surfaces of the electronic device workpieces.

28. A method of orienting electronic device workpieces within an electronic device workpiece processor comprising:
    providing a plurality of electronic device workpieces within an electronic device workpiece processors the providing comprising positioning the electronic device workpieces in a substantially parallel orientation with respect to one another and positioning a first one of the electronic device workpieces intermediate and immediately adjacent to second and third electronic device workpieces, the first electronic device workpiece being spaced from the second electronic device workpiece by a first distance different than a second distance between the first electronic device workpiece and the third electronic device workpiece.

29. The method of claim 28 wherein the electronic device workpieces comprise semiconductor wafers.

30. The method of claim 28 wherein the electronic device workpieces comprises semiconductor wafers within a wafer cassette and providing the wafer cassette containing the semiconductor wafers within the electronic device workpiece processor.

31. The method of claim 28 wherein the positioning comprises positioning the first electronic device workpiece and at least one of the second electronic device workpiece and the third electronic device workpiece with like surfaces facing one another.

32. The method of claim 28 wherein the positioning comprises positioning the first electronic device workpiece, the second electronic device workpiece and the third electronic device workpiece with like surfaces facing one another.

33. The method of claim 28 wherein the providing comprises providing the electronic device workpieces within an electronic device workpiece carrier and providing the electronic device workpiece carrier containing the electronic device workpieces within the electronic device workpiece processor.

34. The method of claim 28 wherein the electronic device workpiece carrier comprises a plurality of guides configured to define workpiece receivers configured to receive the electronic device workpieces and which extend a distance at least half a diameter of one of the electronic device workpieces.

35. The method of claim 28 wherein the electronic device workpiece carrier comprises a plurality of guides configured to define workpiece receivers configured to receive the electronic device workpieces and wherein the guides have different widths in a direction substantially perpendicular to opposing front and back surfaces of the electronic device workpieces.

36. A method of processing electronic device workpieces within an electronic device workpiece processor comprising:
    providing a pair of electronic device workpieces within an electronic device workpiece processor, the providing comprising positioning the electronic device workpieces in a substantially parallel orientation with respect to one another and positioning one of the electronic device workpieces with a like surface of the one electronic device workpiece facing a like surface of the other electronic device workpiece; and
    processing the electronic device workpieces as so positioned within the electronic device workpiece processor.

37. A method of processing electronic device workpieces within an electronic device workpiece processor comprising:

provimding a plurality of electronic device workpieces within an electronic device workpiece processor, the providing comprising positioning the electronic device workpieces in a substantially parallel orientation with respect to one another and positioning a first one of the electronic device workpieces intermediate and immediately adjacent to second and third electronic device workpieces, the first electronic device workpiece being spaced from the second electronic device workpiece by a first distance different than a second distance between the first electronic device workpiece and the third electronic device workpiece; and processing the electronic device workpieces as so positioned within the electronic device workpiece processor.

* * * * *

UNITED STATES PATENT AND TRADEMARK OFFICE
CERTIFICATE OF CORRECTION

PATENT NO.    : 6,344,091 B2
DATED         : February 5, 2002
INVENTOR(S)   : Jeff Mendiola It is certified that error appears in the above-identified patent and that said Letters Patent is hereby corrected as shown below:

Column 5,
Line 21, please delete "." after $P_1$ and insert -- , --.

Column 6,
Line 31, please insert -- . -- after $P_1$.

Column 8,
Line 14, please delete "1" and insert -- 4 --.

Column 10,
Line 8, please delete "processors" and insert -- processor --.

Signed and Sealed this

Ninth Day of July, 2002

Attest:

Attesting Officer

JAMES E. ROGAN
Director of the United States Patent and Trademark Office